United States Patent
Bouyaud

(10) Patent No.: US 8,472,572 B2
(45) Date of Patent: Jun. 25, 2013

(54) RECEIVER WITH AFC FUNCTION FOR OPERATING IN SOFT HANDOVER

(75) Inventor: Mickael Bouyaud, Le Mans (FR)

(73) Assignee: ST-Ericsson SA, Geneva (CH)

( * ) Notice: Subject to any disclaimer, the term of this patent is extended or adjusted under 35 U.S.C. 154(b) by 973 days.

(21) Appl. No.: 12/299,465

(22) PCT Filed: May 2, 2007

(86) PCT No.: PCT/IB2007/051629
§ 371 (c)(1),
(2), (4) Date: Nov. 3, 2008

(87) PCT Pub. No.: WO2007/129258
PCT Pub. Date: Nov. 15, 2007

(65) Prior Publication Data
US 2010/0003989 A1 Jan. 7, 2010

(30) Foreign Application Priority Data
May 4, 2006 (EP) .................................. 06300439

(51) Int. Cl.
*H04L 27/06* (2006.01)
(52) U.S. Cl.
USPC ........ 375/344; 375/141; 375/346; 455/182.2; 455/192.2
(58) Field of Classification Search
USPC .............. 375/130, 132–133, 140–141, 316, 375/344, 354, 356–357; 455/130, 150.1, 455/182.1, 182.2, 192.1, 192.2
See application file for complete search history.

(56) References Cited

U.S. PATENT DOCUMENTS

| 5,349,567 | A * | 9/1994 | Reed ............................... 367/100 |
| 5,764,687 | A * | 6/1998 | Easton ........................... 375/147 |
| 5,960,349 | A * | 9/1999 | Chheda et al. ................. 455/446 |
| 2002/0168995 | A1* | 11/2002 | Terry et al. ..................... 455/522 |
| 2003/0086341 | A1* | 5/2003 | Wells et al. ................. 369/13.56 |

FOREIGN PATENT DOCUMENTS

| EP | 0 991 188 A | 4/2000 |
| EP | 1 148 642 A | 10/2001 |
| EP | 1 530 334 A | 5/2005 |
| WO | WO 02/29978 A | 4/2002 |

* cited by examiner

*Primary Examiner* — Shuwang Liu
*Assistant Examiner* — James M Perez
(74) *Attorney, Agent, or Firm* — William J. Kubida; Peter J. Meza; Hogan Lovells US LLP

(57) ABSTRACT

A receiver having Automatic Frequency Control ("AFC") is described having at least one input signal terminal and an offset frequency estimation means for estimating each offset frequency of at least two predetermined input signals inputted at the same time at the input signal terminal. The access to the receiver of each input signal is respectively modulated and identified by a distinct code, and in addition an AFC means is included to perform automatic frequency control of a voltage control oscillator serving as a frequency reference of the receiver. The AFC means described in the present invention is operative to provide a unique compensation command defined as a function of a combination of at least two analytical terms, each term respectively depending on the estimated offset frequency of the corresponding input signal.

20 Claims, 3 Drawing Sheets

RECEIVER WITH AFC FUNCTION FOR OPERATING IN SOFT HANDOVER

CROSS-REFERENCE TO RELATED APPLICATIONS

The present application is a U.S. national filing of PCT/IB2007/051629 filed May 2, 2007, which is incorporated by reference herein in its entirety.

TECHNICAL FIELD OF THE INVENTION

The present invention relates to a receiver with an Automatic Frequency Control ("AFC") function for use with digital data transmission applicable particularly to land mobile communications.

BACKGROUND OF THE INVENTION

Universal Mobile Telecommunication System ("UMTS") is a world wide system known as an evolution of the Global System for Mobile Communications ("GSM"; originally Groupe Special Mobile) and a mobile communication terminal for use in the UMTS is generally referred to as a UE (User Equipment).

The UMTS is a mobile cellular network comprising a set of base stations BS(i) and user equipments UE(j). The base stations communicate with user equipments through wireless links, using electromagnetic waves referred to as RL (Radio Links).

In a normal mode, a User Equipment UE usually communicates with a single network base BS through two radio links, a downlink DL and an uplink UL. The downlink DL is the radio link RL from the base station BS to the user equipment UE which carries individual channels, for example a DPCH (Dedicated Physical Channel) containing a logical channel DCH (Dedicated Channel) assigned to the user equipment UE.

Generally, the propagation range of a radio link determines a coverage area or cell Ci for each base station BS(i) considered as a node of the cellular network. While being located at the boundary of a currant cell, let C1, and moving from C1 to a at least one adjacent cell $C_{ad}$ (j), the user equipment UE maintains without any interruption a communication call by using simultaneously the same logical channel DCH sent from each adjacent cell base station $BS_{ad}$(i) through their own DPCH(i) whereby each DPCH(j) is different from each other. This mode of operation is called a Soft Handover (SHO). The recombination of the information coming from each cell is done at the symbol level.

It is well known that frequency offset that occurs in a mobile communication system causes unavoidable performance deterioration. Frequency offset may be generated by the frequency drift of oscillators with temperature and/or Doppler effect on propagation waves. An AFC (Automatic Frequency Control) operation for compensating for the frequency offset is therefore needed. Many receivers with an automatic frequency control function have been already described extensively for radio mobile physical channel under various propagation conditions as determined by Rayleigh Rice and/or multipath signals. In all cases, the radio link RL, herein using a DPCH, is considered as a distinct, fully characterized signal.

The objective problem is that there exists no receiver with an AFC function that operates in soft handover mode and also efficiently compensates the offset frequencies of the various radio links in order to demodulate the unique logical channel DCH in a simple way and with high performance.

SUMMARY OF THE INVENTION

One aim of the present invention is to provide a simple receiver structure with an AFC function that is able to operate in soft handover mode as used in UMTS while providing high performance.

The invention accordingly relates to an Automatic Frequency Control ("AFC") receiver that includes: at least one input signal terminal; offset frequency estimation means for estimating each offset frequency of at least two predetermined input signals inputted at the same time at the input signal terminal, the access to the receiver of each input signal being respectively modulated and identified by a distinct code; and an AFC means to perform automatic frequency control of a voltage control oscillator serving as a frequency reference of the receiver.

According to one embodiment of the present invention the AFC means are operative to provide a unique compensation command defined as a function of a combination of at least two analytical terms, each term respectively depending on the estimated offset frequency of the corresponding input signal.

According to another embodiment of the present invention, the receiver comprises one or more of the following characteristics: a normalized power estimation means for estimating the power of each input signal, for selecting a set of at least two input signals and for normalizing each power estimation of the selected input signals over the total power of the selected signals; the value of each analytical term is real; the compensation command is a linear combination of real valued terms; the value of each analytical term is unitary complex; the command is the angular polar coordinate of a linear combination of complex valued term; the input signal terminal is unique; each signal is CDMA modulated; and a different frequency carrier is assigned to each signal.

Embodiments of the present invention also relate to a utilization of the receiver in a UMTS or 3G radio mobile system during a soft handover procedure.

The present invention further relates to a method for performing Automatic Frequency Control (AFC) of a receiver receiving at least two predetermined input signals inputted at the same time at an input signal terminal, wherein the access to the receiver of each input signal is respectively modulated and identified by a distinct code. The method includes the steps of: estimating each offset frequency of the at least two predetermined input signals, and providing a compensation command to control a voltage oscillator serving as a frequency reference of the receiver.

According to one embodiment of the present invention, the compensation command is unique and determined as a function of a combination of at least two analytical terms, each term respectively depending on the estimated offset frequency of the corresponding input signal.

According to other embodiments of the present invention, the receiver can be operative to: estimate the power of each input signal, select a set of at least two input signals, and/or normalize each power estimation of the selected input signals over the total power of the selected signals.

BRIEF DESCRIPTION OF THE FIGURES

A better understanding of the invention will be facilitated by reading the following description, which is given solely by way of examples and with reference to the drawings, in which.

DETAILED DESCRIPTION

Figure 1:
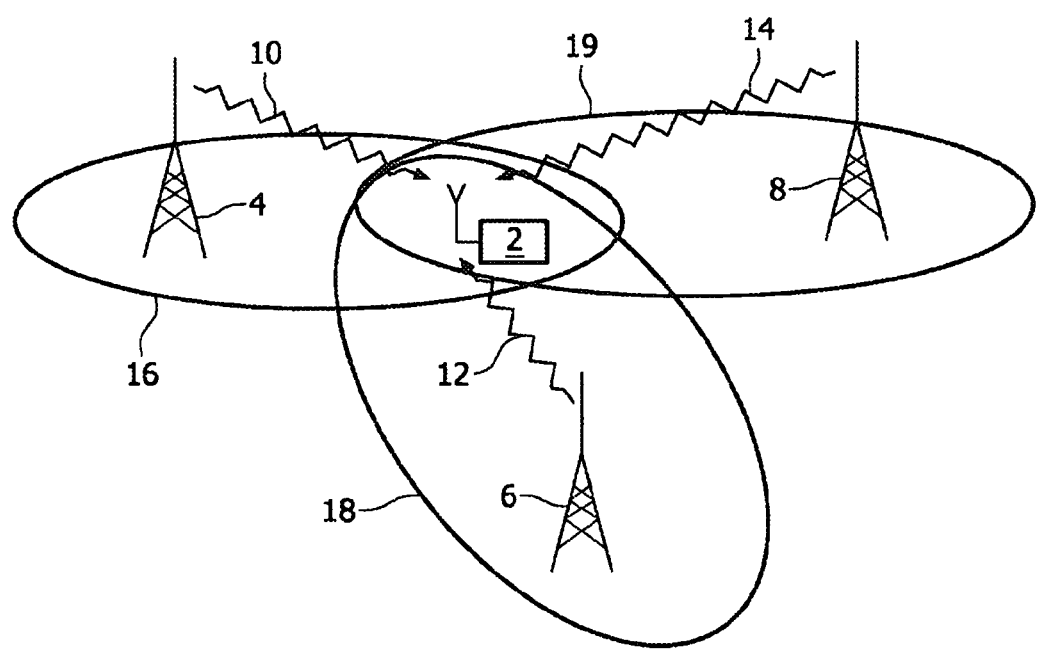
FIG. 1 illustrates a soft handover configuration in a UMTS system.

FIG. 1 illustrates a soft handover configuration 1 in UMTS showing a user equipment 2 receiving from a set of base stations, herein three base stations 4, 6, 8 a same logical channel carried onto three different physical channels through three different radio links 10, 12, 14. Thus, a first signal $S_1$ from a first base station 4 through a first radio link 10, a second signal $S_2$ from a second base station 8 through a second radio link 12 and a third signal $S_3$ from a third base station 12 through a third radio link 14 are received by the user terminal.

Cells 16, 18, 19 are respectively defined as radio coverage areas of each base station 4, 6, 8 depending particularly on radio waves propagation conditions. The user terminal 2 is located in a common coverage area of the three cells at the boundary of each cell. The three signals $S_1$, $S_2$, $S_3$ are designed in order to avoid any mutual destructive interference. Herein, using a CDMA access scheme, each signal is modulated by a respective pseudo-noise code.

Able to receive at the same time the three signals, that is $S_1+S_2+S_3$, the user equipment 2 can get the benefit as a diversity gain to receive correctly the logical channel without any communication interruption while moving from one cell to a or some neighboring cells. Hence, this configuration enables a soft handover to be carried out. In order to carry out such a soft handover, the user equipment 2 comprises a receiver 20 with architecture able to handle the soft handover mode.

Figure 2:
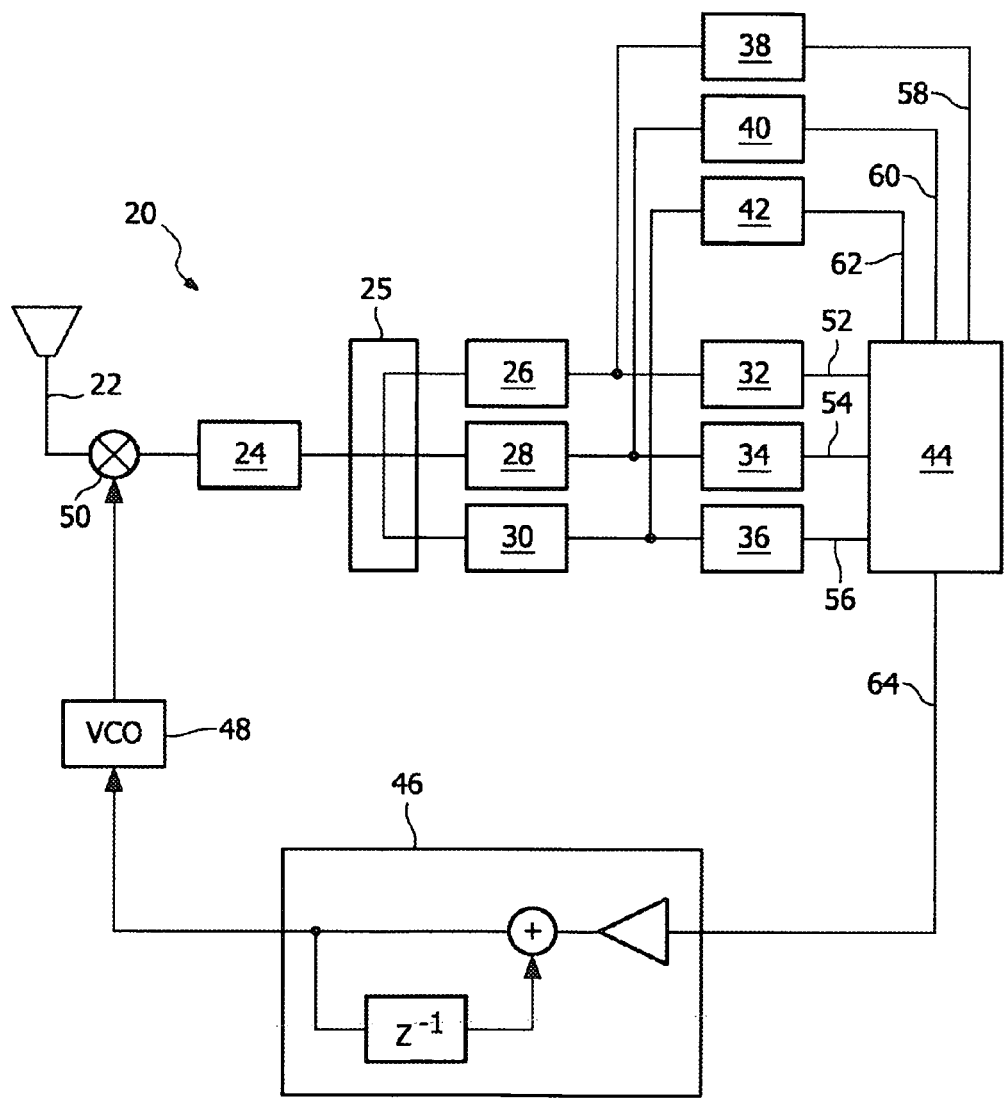
FIG. 2 illustrates a block diagram of a receiver with an AFC function.

FIG. 2 illustrates a block diagram of the receiver 20 able to handle soft handover in a wide band CDMA system with an AFC function suited to soft handover configuration. The receiver 20 comprises an input terminal 22, herein a single one, connected to a unique antenna. The receiver 20 also comprises a roll off filter 24 at the output of the antenna. The filter 24 is designed to reject generated noise out of the useful signal band and followed by an output multiplexer 25 to feed three despreaders 26, 28, 30 respectively assigned to first, second and third signals through three lines.

A first set of three offset frequency estimators 32, 34, 36 and a second set of three signal power estimators 38, 40, 42 are provided in the receiver 20. An estimator of each set is inputted from a despreader 26, 28, 30 so that each signal in supplied to two different estimators. The receiver 20 also comprises an offset frequency combiner 44 designed for soft handover to determine the offset frequency compensation of the received signal frequency drift due to frequency drift of oscillators with temperature Doppler effect and/or on propagation waves. The offset frequency combiner 44 is followed by an integrator 46 and a voltage control oscillator 48 (VCO) to feed a receiver input mixer 50 connected to the input of the roll off filter 24.

The offset frequency combiner 44 comprises a set of three combiner offset frequency inputs 52, 54, 56 respectively inputted by output lines issued from the frequency estimators 32, 34, 36. The offset frequency combiner 44 also comprises a set of three combiner power inputs 58, 60, 62 respectively inputted by output lines issued from the power estimators 38, 40, 42 and a combiner frequency output 64.

Optionally, the frequency offset estimators 32, 34, 36 are RAKE receiver type. Any structure for offset frequency estimators 32, 34, 36 is convenient and within the scope of the present invention.

Figure 3:
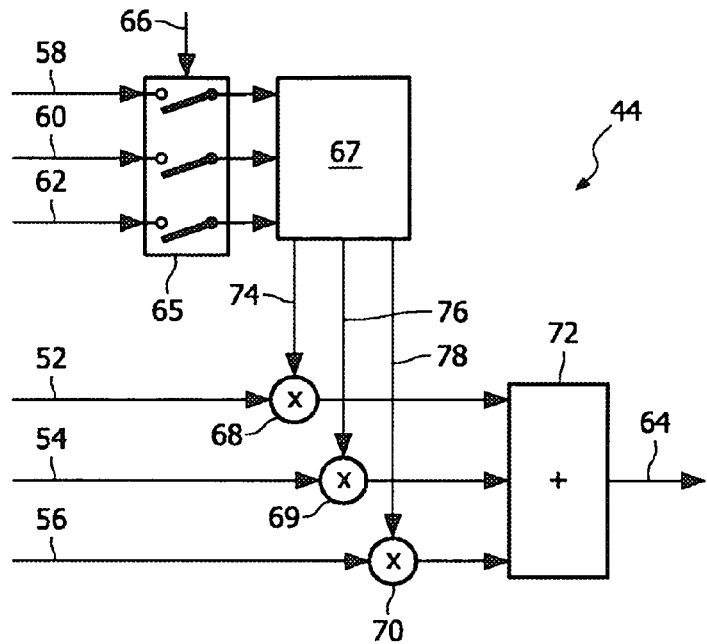
FIG. 3 illustrates a block diagram of an offset frequency combiner according to a first embodiment.

FIG. 3 illustrates a block diagram of the offset frequency combiner 44 according to a first embodiment.

The offset frequency combiner 44 includes a cell server switch unit 65 to select on a one per line basis the output lines issued from the power estimators 38, 40, 42 to be processed. The switch unit 65 is controlled by a switch command inputted at a cell server switch control input 66. The combiner 44 comprises further a power normalizer 67 to normalize each output line issued from the cell server switch unit and a set of three real input multipliers 68, 69, 70 and a real adder 72 operating with real values.

Each real input multiplier 68, 69, 70 is firstly and respectively inputted by each line issued from each combiner offset frequency input 52, 54, 56. Each real input multiplier is secondly and respectively inputted by each line issued from power normalizer output 74, 76, 78 corresponding to each combiner power input 58, 60, 62. The real adder 72 comprises three inputs, each one fed by respective signal outputted from each real input multiplier 68, 69, 70, and an output connected to the frequency combiner output 64. It should be noticed that each line shown in FIG. 3 is a single wire line.

While operating in soft handover configuration 1, as shown in FIG. 1, the receiver 20 receives simultaneously at its single input terminal 22 connected to a single antenna three CDMA signals $S_i$ (i=1 to 3), each signal access modulated with a different pseudo noise code $PN_i$. When received at input terminal 22, each carrier frequency of signal $S_i$ exhibits a frequency offset δfi relative to local oscillator frequency $f_o$ as set by the VCO 48 of the user terminal 2. The received signal as the sum of each $S_i$ and noise is filtered by the roll off filter 24. The signal outputted from the filter 24 is then divided into three identical signals through the output multiplexer 25. Each despreader 26, 28, 30 with its assigned code $PN_i$ respectively correlates the filtered divided overall signal $S_1+S_2+S_3$ with $S_1$ and eventually determines a dominant finger corresponding to multipath conditions. Thus, each despreader 26, 28, 30 extracts the signal $S_i$ from the divided overall signal and provides respectively the signal $S_i$ to each power estimator 40, 42, 44 and to each frequency offset estimator 32, 34, 36.

Each power estimator 38, 40, 42 determines respectively a power value Pi of each signal $S_i$, while each offset frequency estimator 32, 34, 36 estimates respectively offset frequency estimated value $\delta_i$ corresponding to actual frequency offset values δfi of received signal $S_i$. Each value $\epsilon_i$ (i=1 to 3) is provided at each combiner offset frequency input 52, 54, 56. Each value $P_i$ (i=1 to 3) is provided at each power combiner input 58, 60, 62.

When all the lines of the switch unit 65 are switched on the frequency offset combiner 44 determines the resulting offset frequency value $\epsilon_R$ on the basis of a set of values as $\epsilon i$ and $P_i$ according to a predetermined formula.

By using the offset frequency combiner 44 architecture as described in FIG. 3:

$$\varepsilon_R = \sum_{i=1}^{3} \frac{P_i}{P} \varepsilon_i \qquad \text{(Method 1)}$$

Where P is determined by the power normalyzer 67 with $$P = \sum_{i=1}^{3} P_i$$

and Pi/P are calculated and outputted by the power normalyzer.

In a variant, that all $P_i$ are optionally set equal, in which case:

$$\varepsilon_R = \sum_{i=1}^{3} \frac{1}{3} \varepsilon_I$$

This is done in case no power estimator 38, 40, 42 or normalizer 67 are provided.

Figure 4:
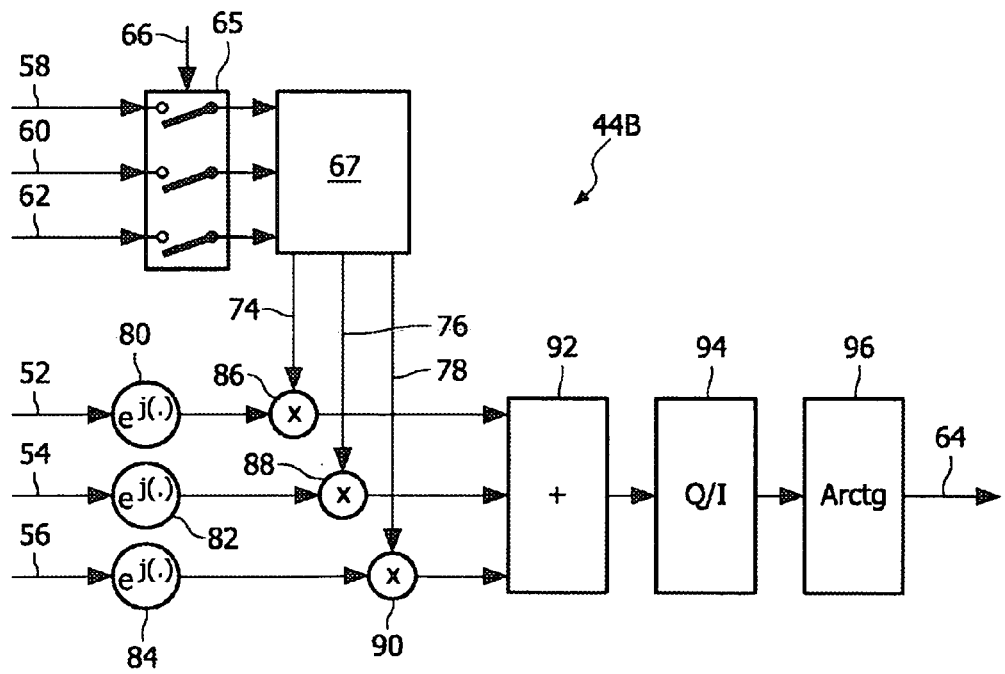
FIG. 4 illustrates a block diagram of an offset frequency combiner according to a second embodiment.

FIG. 4 illustrates a block diagram of a frequency offset combiner denoted 44B according to a second embodiment. The combiner 44B according to the second embodiment comprises the cell server switch unit 65, the power normalizer 67, a set of three unitary complex transformers 80, 82, 84 followed respectively by a set of three complex input multipliers 86, 88, 90. The combiner 44B also comprises a complex input adder 92 fed by each output of the three complex input multipliers 86, 88, 90, a tangent argument determining unit 94 and an arc tangent calculator unit 96 following sequentially the complex input adder 92. Each unitary complex transformer 80, 82, 84 is inputted by a first real valued scalar signal issued from each combiner offset frequency input 52, 54, 56, and each unitary complex transformer 80, 82, 84 is able to output a complex valued signal as a two-dimensions vector signal with two lines, even if illustrated as a single line in FIG. 4.

In addition, each complex input multiplier 86, 88, 90 is firstly inputted by each line issued from each combiner offset frequency input 52, 54, 56, and each complex input multiplier 86, 88, 90 is secondly inputted by each line issued from each line issued from each power normalizer output 74, 76, 78.

Lines connecting each complex input multiplier 86, 88, 90 to each input of the cell server switch are double wire lines, and lines connecting the complex input adder 92 to the cell server switch 88, the adder 92 to the tangent argument determining unit 94 are also double wire lines as carrying two-dimensions vectors. It should be noted that all these double wire lines are also shown as single lines in FIG. 4.

While operating in soft handover configuration 1, as shown in FIG. 1, the receiver 20 receives simultaneously at its single input terminal 22 connected to a single antenna three CDMA signals $S_i$ (i=1 to 3), each signal access modulated with a different pseudo noise code $PN_i$.

The received overall signal as the sum of each $S_i$ and noise is processed in a similar way than for the receiver 20 using the first embodiment combiner 44 to provide respective value $\varepsilon_i$ (i=1 to 3) at each combiner offset frequency input 52, 54, 56 and to provide respective value $P_i$ (i=1 to 3) at each power combiner input 58, 54, 56.

Then, the cell server switch 66 selects the $P_i$ values to be processed and provides the selected values $I_{Serv}(i) P_i$ to the power normalizer 67, wherein $I_{Serv}(i)$ is equal to 1 if $P_i$ selected, zero otherwise. The power normalizer 67 normalizes each selected $P_i$ to provide a $$\frac{P_i}{P}$$

value where $$P = \sum_{i=1}^{3} I_{serv}(i) P_i.$$

If $P_i$ is not selected, the power normalizer 67 provides a null value at the corresponding power normalizer output. Generally, each output value issued from the power normalizer output 77, 76, 78 can be written $I_{Serv}(i).P_i/P$ (i=1 to 3).

Each unitary complex transformer 80, 82, 84 transforms one respective real value $\varepsilon_i$ (i=1, to 3) into its unitary complex form $e^{(j \cdot \varepsilon_i)}$ and feeds this resulting complex value to one complex multiplier 86, 88, 90. Then, each complex input multiplier 86, 88, 90 multiplies respectively one output value issued from power normalizer output 77, 76, 78 with one unitary complex value issued from one unitary complex transformer 80, 82, 84.

The adder 92 adds each value issued from the complex input multipliers 86, 88, 90 and the tangent argument determining unit 94 calculates for the resulting sum the ratio of its imaginary part Q to the real part I. Finally, the Arctangent unit 96 determines the inverse tangent of the calculated ratio.

By using the offset frequency combiner 44B architecture as described in FIG. 4, we get:

$$\varepsilon_R = \arg\left(\sum_{i=1}^{3} I_{serv}(i) \frac{P_i}{P} e^{(j \cdot \varepsilon_i)}\right) \quad \text{(Method 2)}$$

where arg is the argument function carried out by units 94 and 96 as $$\arg(.) = \arctan g\left(\frac{Q}{I}\right)$$

with Q and I as respectively imaginary part and real part of the inputted complex value.

$I_{Serv}(i)$ is the switching state of $S_i$ indicating whether the cell $C_i$ is serving the user equipment 2.

$I_{Serv}(i)$=1 if $C_1$ is serving, $I_{Serv}(i)$=0 if not

It should be noticed that the cell server switch 65 may be implemented in architecture of $1^{St}$ embodiment but also at output multiplexer 25 level or even at command level of the activation of the despreaders 32, 34, 36.

The methods described herein are estimation methods derived from a maximum likelyhood or Bayesian approach. The integrator 46 integrates the resulting offset frequency $\varepsilon_R$, and the output of the integrator 46 supplies a voltage to control the VCO 48. The receiver input mixer 50 receives the sum of the offset frequency and the carrier frequency from VCO 50, substract the carrier frequency of received overall signal $S_1+S_2+S_3$ and outputs the resultant offset frequency which is therefore driven to zero.

Using such a method or its variants provides an efficient way to estimate offset frequency for a UMTS or 3G system, in particularly during a soft handover procedure.

Another advantage of the present invention is that the receiver architecture is simplified in regard to AFC function during a soft handover, in particular in a CDMA system wherein the number of antennas is minimized, and the input terminal may be unique.

Another advantage of the invention is that the receiver with AFC function according the invention is also able to integrate a RAKE structure not only for data decision but also for offset frequency estimation.

Although the invention has been described and illustrated with a certain degree of particularity, it is understood that the present disclosure has been made only by way of example and that numerous changes in the combination and arrangement of parts can be resorted to by those skilled in the art without departing from the spirit and scope of the invention, as hereinafter claimed.

The invention claimed is:

1. A receiver with Automatic Frequency Control ("AFC"), said receiver comprising:
    at least one input signal terminal;
    an offset frequency estimation means for estimating each offset frequency of at least two predetermined input signals inputted at the same time at the input signal terminal, access to the receiver of each input signal being respectively modulated and identified by a distinct code, wherein the offset frequency estimation means includes a plurality of frequency estimators; and
    AFC means distinct from and coupled to the offset frequency estimation means to perform automatic frequency control of a voltage control oscillator serving as a frequency reference of the receiver, characterized in that the AFC means are able to provide a unique compensation command defined as a function of a combination of at least two analytical terms, wherein the AFC means includes a plurality of power estimators for estimating the power for each of the at least two predetermined input signals, and wherein each analytical term is respectively generated by multiplying the estimated offset frequency with the estimated power of the corresponding input signal.

2. The receiver of claim 1, further comprising normalized power estimation means for estimating the power of each input signal for selecting a set of at least two input signals and normalizing each power estimation of the selected input signals over the total power of the selected signals.

3. The receiver of claim 1, wherein the value of each analytical term is real.

4. The receiver of claim 3, wherein the compensation command is a linear combination of real valued terms.

5. The receiver of claim 1, wherein the value of each analytical term is unitary complex.

6. The receiver of claim 1, wherein the command is the angular polar coordinate of a linear combination of complex valued term.

7. The receiver of claim 1, wherein the input signal terminal is unique.

8. The receiver of claim 1, wherein each signal is CDMA modulated.

9. The receiver of claim 1, wherein a different frequency carrier is assigned to each signal.

10. The receiver of claim 1, wherein the receiver is used during a soft handover procedure in a UMTS or 3G radio mobile system.

11. The receiver of claim 1, wherein the offset frequency estimation means further comprises a plurality of despreaders coupled to the plurality of frequency estimators.

12. The receiver of claim 1, wherein the offset frequency estimation means further comprises a multiplexer coupled to the plurality of frequency estimators.

13. The receiver of claim 1, wherein the AFC means further comprises a frequency combiner coupled to the plurality of power estimators.

14. The receiver of claim 13, wherein the frequency combiner comprises a normalizer.

15. A method to perform Automatic Frequency Control ("AFC") on a receiver receiving at least two predetermined input signals inputted at the same time at an input signal terminal, the access to the receiver of each input signal being respectively modulated and identified by a distinct code, the said method comprising:
    providing a receiver having an offset frequency estimator portion including a plurality of frequency estimators and an AFC portion including a plurality of power estimators, wherein the offset frequency estimator portion and the AFC portion are distinct from each other and coupled together;
    estimating each power of the at least two predetermined input signals by the plurality of power estimators;
    estimating each offset frequency of the at least two predetermined input signals by the plurality of frequency estimators; and
    executing a compensation command to control a voltage oscillator serving as a frequency reference of the receiver, wherein the compensation command is unique and determined as a function of a combination of at least two analytical terms, and each analytical term is respectively generated by multiplying the estimated offset frequency with the estimated power of the corresponding input signal.

16. The method of claim 15, further comprising:
    estimating the power of each input signal;
    selecting a set of at least two input signals; and
    normalizing each power estimation of the selected input signals over the total power of the selected signals.

17. The method of claim 15, wherein the offset frequency estimation portion further comprises a plurality of despreaders coupled to the plurality of frequency estimators.

18. The method of claim 15, wherein the offset frequency estimation portion further comprises a multiplexer coupled to the plurality of frequency estimators.

19. The method of claim 15, wherein the AFC portion further comprises a frequency combiner coupled to the plurality of power estimators.

20. The method of claim 19, wherein the frequency combiner comprises a normalizer.

* * * * *